(12) United States Patent
Zeng

(10) Patent No.: US 9,396,691 B2
(45) Date of Patent: Jul. 19, 2016

(54) METHOD FOR COMPENSATING RESISTANCE OF SIGNAL LINES OF GATE DRIVING CIRCUITS AND LIQUID CRYSTAL PANEL APPLYING THE SAME

(71) Applicant: Shenzhen China Star Optoelectronics Technology Co., Ltd., Shenzhen, Guangdong (CN)

(72) Inventor: Limei Zeng, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 324 days.

(21) Appl. No.: 14/347,624

(22) PCT Filed: Jan. 21, 2014

(86) PCT No.: PCT/CN2014/070960
§ 371 (c)(1),
(2) Date: Mar. 26, 2014

(87) PCT Pub. No.: WO2015/100815
PCT Pub. Date: Jul. 9, 2015

(65) Prior Publication Data
US 2015/0379951 A1 Dec. 31, 2015

(30) Foreign Application Priority Data
Dec. 31, 2013 (CN) .......................... 2013 1 0753955

(51) Int. Cl.
*G09G 3/36* (2006.01)
*H03K 3/012* (2006.01)

(52) U.S. Cl.
CPC ............ *G09G 3/3655* (2013.01); *G09G 3/3648* (2013.01); *G09G 3/3681* (2013.01); *G09G3/3622* (2013.01); *G09G 2300/0426* (2013.01); *G09G 2300/08* (2013.01); *G09G 2310/0264* (2013.01); *G09G 2320/0223* (2013.01); *H03K 3/012* (2013.01)

(58) Field of Classification Search
CPC .............................. G09G 3/3622; H03K 3/012
USPC ....................................................... 345/87, 92
See application file for complete search history.

(56) References Cited

U.S. PATENT DOCUMENTS

2002/0000961 A1* 1/2002 Kang .................. G02F 1/13452
345/87
2014/0176410 A1* 6/2014 Ma ....................... G09G 3/3622
345/92

FOREIGN PATENT DOCUMENTS

CN 1495700 A 5/2004
CN 102034412 A 4/2011

*Primary Examiner* — Amare Mengistu
*Assistant Examiner* — Joseph G Rodriguez
(74) *Attorney, Agent, or Firm* — Andrew C. Cheng

(57) ABSTRACT

A method for compensating resistance of signal lines of gate driving circuits and the liquid crystal panel applying the method are provided. The method includes: (1) providing a TFT substrate having a GOA area arranged thereon, the GOA area comprises a plurality of GOA units, each of the GOA units comprises a plurality of GOA modules electrically connects to one pull-line; (2) providing a control system board electrically connecting to the GOA modules via the pull-lines; and (3) adjusting the resistance between the control system board and the GOA modules such that the clock signals provided from the control system board to the GOA modules within the same GOA unit is the same. As such, the delays of the gate driving signals are the same, and the charging rate of the two adjacent pixel rows are the same. In this way, the gray scales of the two adjacent pixel rows are the same, not only the stripes are avoided but also the display performance is enhanced.

6 Claims, 6 Drawing Sheets

METHOD FOR COMPENSATING RESISTANCE OF SIGNAL LINES OF GATE DRIVING CIRCUITS AND LIQUID CRYSTAL PANEL APPLYING THE SAME

BACKGROUND OF THE INVENTION

1. Field of the Invention

The present disclosure relates to flat panel display technology, and more particularly to a method for compensating resistance of signal lines of gate driving circuits and the liquid crystal panel applying the same.

2. Discussion of the Related Art

LCDs typically are characterized by attributes including thin, power-saving, and low radiation. These are reasons that the LCDs have been widely adopted by devices, such as mobile phones, personal data assistant (PDA), digital cameras, monitors for personal computers or notebooks.

Most of the LCDS are backlight-type devices, including a housing, a liquid crystal panel and a backlight module arranged within the housing. Conventional liquid crystal panel includes a color filter, a Thin Film Transistor Array Substrate (TFT Array Substrate) and a liquid crystal layer disposed between the two substrates. The operating principle relates to applying a driving voltage to the two glass substrate to control the liquid crystal alignment within the liquid crystal layer such that the light beams from the backlight module are reflected to generate images. Thus, the backlight module is one key component of LCDs. Backlight module may be divided into two categories, including edge-type and direct-lit backlight, according to the incident location of the light source. With respect to the direct-lit backlight, the Cold Cathode Fluorescent (CCFL) Lamp or the Light Emitting Diode (LED) is arranged behind the liquid crystal panel, which forms a surface light source for the liquid crystal panel. With respect to the edge-type backlight, the LED bar is arranged on the edges of the back plate disposed behind the liquid crystal panel. The light beams emitted from the LED light bar enters the light guiding plate (LGP) from a light incident surface of the LGP, and the then reflected and diffused within the LGP. Afterward, the light beams emit out from a light emitting surface of the LGP, and then pass through an optical film set so as to form the surface light source for the liquid crystal panel.

Gate driving on array (GOA) technology has been commonly adopted recently for manufacturing narrow border or frameless products. The limited space may result in the resistances of the signals line are not qualified, or are deviated from desired values.

FIG. 1 shows a GOA dual-driven panel. The control board system connects to the TFT via flexible printed circuits (FPC) to provide a variety of signals. The length of the four pull-lines of the clock signals, which are arranged on the pull-line area, are different. CK4 is the longest one and CK1 is the shortest one, which may result in that the RC delay of CK4 is larger than that of CK1. As R4C4>R3C3>R2C2>R1C1, the four signal lines have different initial waveforms when entering GOA. As shown in FIG. 2, the waveforms of CK4 through CK1 changes in sequence. It can be seen that the RC delay of the waveform of CK4 is the largest one, and that of CK4 is the smallest one. That is, the waveform of CK1 is the best one.

Most of the time, the RC delay of the clock signals of GOA have to be the same as the clock signals are Gate signals inputted to the active area (AA). Gate signals are for turning on TFTs arranged on the pixels arranged on one horizontal row such that the source signals charges the pixel electrode. The difference between the RC delays of two clock signals may result in different gate delay, also different charging state. At this moment, the gray scale of the two adjacent pixel rows with different charging rate may be different. As such, users may see horizontal bright-and-dark fringes, and this may become more obvious while the signals are passed downward along with shift registers.

SUMMARY

The object of the invention is to provide a method for compensating resistance of signal lines of gate driving circuits ("the method"). Without adding any cost, the method may effectively solve the issue of different RC delay of clock signals so as to improve the display performance.

Another object of the invention is to provide a liquid crystal panel with simple structure, low cost, and good display performance.

In one aspect, a method for compensating resistance of signal lines of gate driving circuits includes: (1) providing a TFT substrate having a GOA area arranged thereon, the GOA area includes a plurality of GOA units, each of the GOA units includes a plurality of GOA modules electrically connecting to one pull-line; (2) providing a control system board electrically connecting to the GOA modules via the pull-lines; and (3) adjusting the resistance between the control system board and the GOA modules such that the clock signals provided from the control system board to the GOA modules within the same GOA unit is the same.

Wherein in step (3), resistors corresponding to the pull-lines are arranged on the control system board to adjust the resistance between the control system board and the GOA modules such that the RC delay of the clock signals provided from the control system board to the GOA modules within the same GOA unit is the same.

Wherein each of the GOA unit includes a first GOA module, a second GOA module, a third GOA module, and a fourth GOA module arranged in sequence, the pull-lines includes a first pull-line, a second pull-line, a third pull-line, and a fourth pull-line electrically connecting to the first GOA module, the second GOA module, the third GOA module, and the fourth GOA module respectively, the length of the first pull-line, the second pull-line, the third pull-line, and the fourth pull-line increases in sequence, the control system board further includes a first resistor, a second resistor, and a third resistor respectively corresponding to the first pull-line, the second pull-line, and the third pull-line, the resistance of the first pull-line, the second pull-line, the third pull-line, and the fourth pull-line are respectively R1, R2, R3, and R4, the capacitance of the first pull-line, the second pull-line, the third pull-line, the fourth pull-line are respectively C1, C2, C3, and C4, the resistance of the first resistor, the second resistor, and the third resistor are respectively Ra, Rb, and Rc, and (R1+Ra)×C1=(R2+Rb)×C2=(R3+Rc)×C3=R4×C4.

Wherein the control board system connects to the pull-lines via flexible printed circuits (FPC).

Wherein the TFT substrate further includes a source driving chip.

In another aspect, a method for compensating resistance of signal lines of gate driving circuits includes: (1) providing a TFT substrate having a GOA area arranged thereon, the GOA area includes a plurality of GOA units, each of the GOA units includes a plurality of GOA modules electrically connects to one pull-line; (2) providing a control system board electrically connecting to the GOA modules via the pull-lines; (3) adjusting the resistance between the control system board and the GOA modules such that the clock signals provided from the control system board to the GOA modules within the same GOA unit is the same; and wherein in step (3), resistors corresponding to the pull-lines are arranged on the control system board to adjust the resistance between the control system board and the GOA modules such that the RC delay of the clock signals provided from the control system board to the GOA modules within the same GOA unit is the same.

Wherein each of the GOA unit includes a first GOA module, a second GOA module, a third GOA module, and a fourth GOA module arranged in sequence, the pull-lines includes a first pull-line, a second pull-line, a third pull-line, and a fourth pull-line electrically connecting to the first GOA module, the second GOA module, the third GOA module, and the fourth GOA module respectively, the length of the first pull-line, the second pull-line, the third pull-line, and the fourth pull-line increases in sequence, the control system board further includes a first resistor, a second resistor, and a third resistor respectively corresponding to the first pull-line, the second pull-line, and the third pull-line, the resistance of the first pull-line, the second pull-line, the third pull-line, and the fourth pull-line are respectively R1, R2, R3, and R4, the capacitance of the first pull-line, the second pull-line, the third pull-line, the fourth pull-line are respectively C1, C2, C3, and C4, the resistance of the first resistor, the second resistor, and the third resistor are respectively Ra, Rb, and Rc, and $(R1+Ra) \times C1 = (R2+Rb) \times C2 = (R3+Rc) \times C3 = R4 \times C4$.

Wherein the control board system connects to the pull-lines via FPC.

Wherein the TFT substrate further includes a source driving chip.

In another aspect, a liquid crystal panel includes: a TFT substrate, a CF substrate relatively bonding to the TFT substrate, a liquid crystal layer arranged between the TFT substrate and the CF substrate, and a control system board electrically connecting to the control system board, the TFT substrate includes a GOA area arranged thereon, the GOA area includes a plurality of GOA units, each of the GOA units includes a plurality of GOA modules, the control system board electrically connects to the GOA modules via the pull-lines for providing the clock signals for the GOA modules, resistors corresponding to the pull-lines are arranged on the control system board such that the RC delay of the clock signals received by the GOA modules within the same GOA unit is the same.

Wherein each of the GOA unit includes a first GOA module, a second GOA module, a third GOA module, and a fourth GOA module arranged in sequence, the system control board electrically connects to the first GOA module, the second GOA module, the third GOA module, and the fourth GOA module respectively via the first, second, third, and fourth pull-lines for respectively providing the first, second, third, and fourth clock signals such that the RC delay of the first, second, third, and fourth clock signals are the same.

Wherein the length of the first pull-line, the second pull-line, the third pull-line, and the fourth pull-line increases in sequence, the control system board further includes a first resistor, a second resistor, and a third resistor respectively corresponding to the first pull-line, the second pull-line, and the third pull-line, the resistance of the first pull-line, the second pull-line, the third pull-line, and the fourth pull-line are respectively R1, R2, R3, and R4, the capacitance of the first pull-line, the second pull-line, the third pull-line, the fourth pull-line are respectively C1, C2, C3, and C4, the resistance of the first resistor, the second resistor, and the third resistor are respectively Ra, Rb, and Rc, and $(R1+Ra) \times C1 = (R2+Rb) \times C2 = (R3+Rc) \times C3 = R4 \times C4$.

Wherein the control board system connects to the pull-lines via FPC, and the TFT substrate further includes a source driving chip.

Wherein the number of the resistors is one less than that the number of the pull-lines.

In view of the above, by arranging resistors on the control system board, the clock signals provided from the control system board to the GOA modules within the same GOA unit have the same RC delay. As such, the delay of the gate driving signals are the same and the charging rate of two adjacent pixel rows are the same. Thus, the two pixels rows have the same gray scale, which not only avoids the stripes but also enhance the display performance.

In order to further understand the characteristics of the invention as well as technical content, see the following detailed description of the present invention and the accompanying drawings, drawings, however, for reference purposes only and description of use is not intended to limit the present invention.

BRIEF DESCRIPTION OF THE DRAWINGS

Below in conjunction with the accompanying drawings, through a specific embodiment of the present invention is described in detail, and will make apparent the technical solution of the present invention, and other beneficial effects.

DETAILED DESCRIPTION OF THE EMBODIMENTS

Embodiments of the invention will now be described more fully hereinafter with reference to the accompanying drawings, in which embodiments of the invention are shown.

Figure 1:
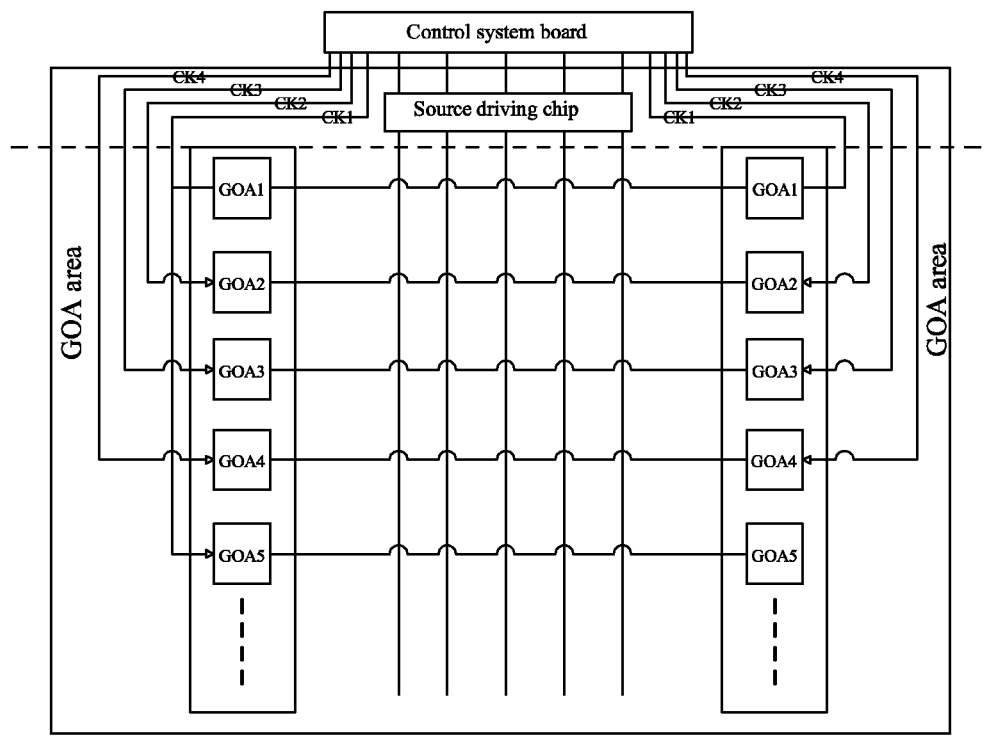
FIG. 1 is a driving circuit diagram of one conventional liquid crystal panel.
Figure 2:
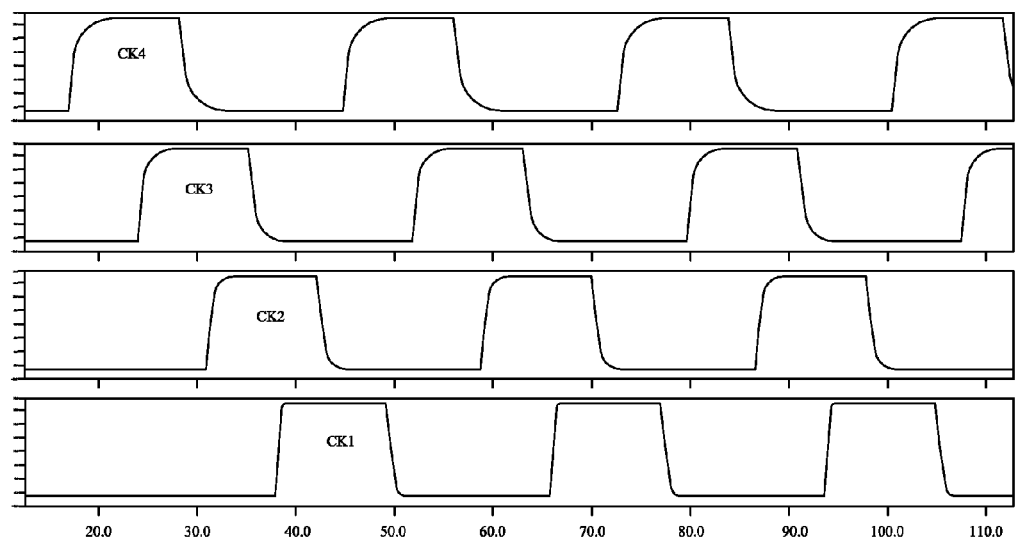
FIG. 2 is a waveform diagram of each clock signals when being driven by the driving circuit of FIG. 1.
Figure 3:
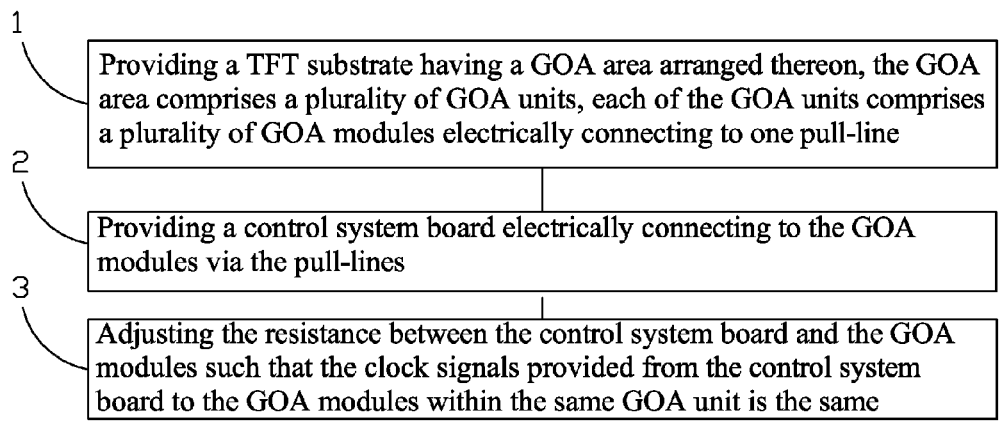
FIG. 3 is a flowchart showing the method for compensating resistance of signal lines of gate driving circuits in accordance with one embodiment.
Figure 4:
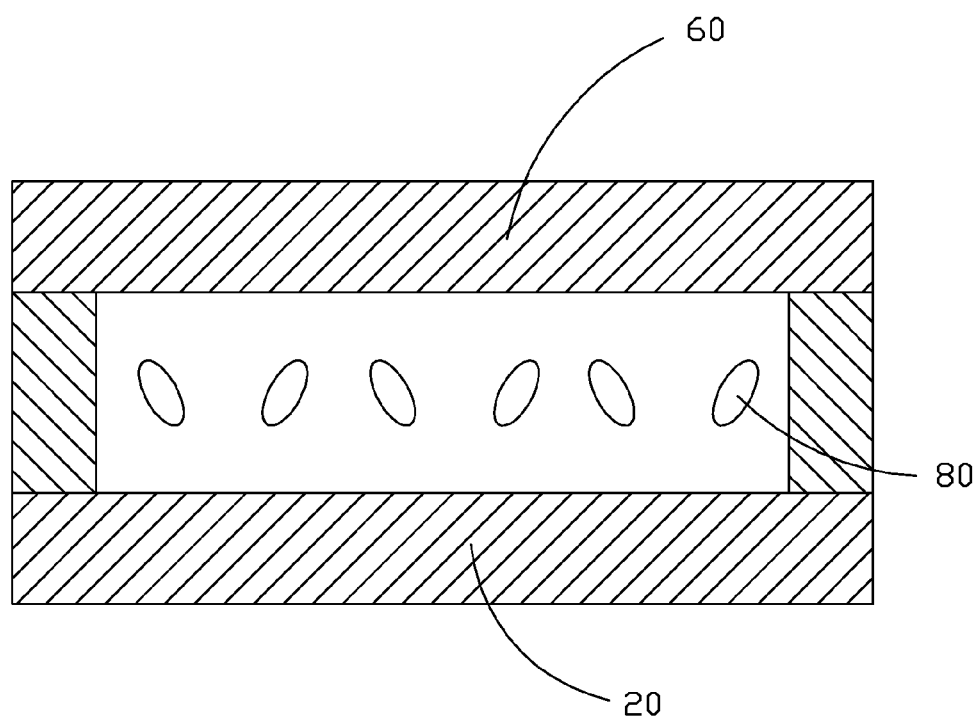
FIG. 4 is a schematic view of the liquid crystal panel in accordance with one embodiment.
Figure 5:
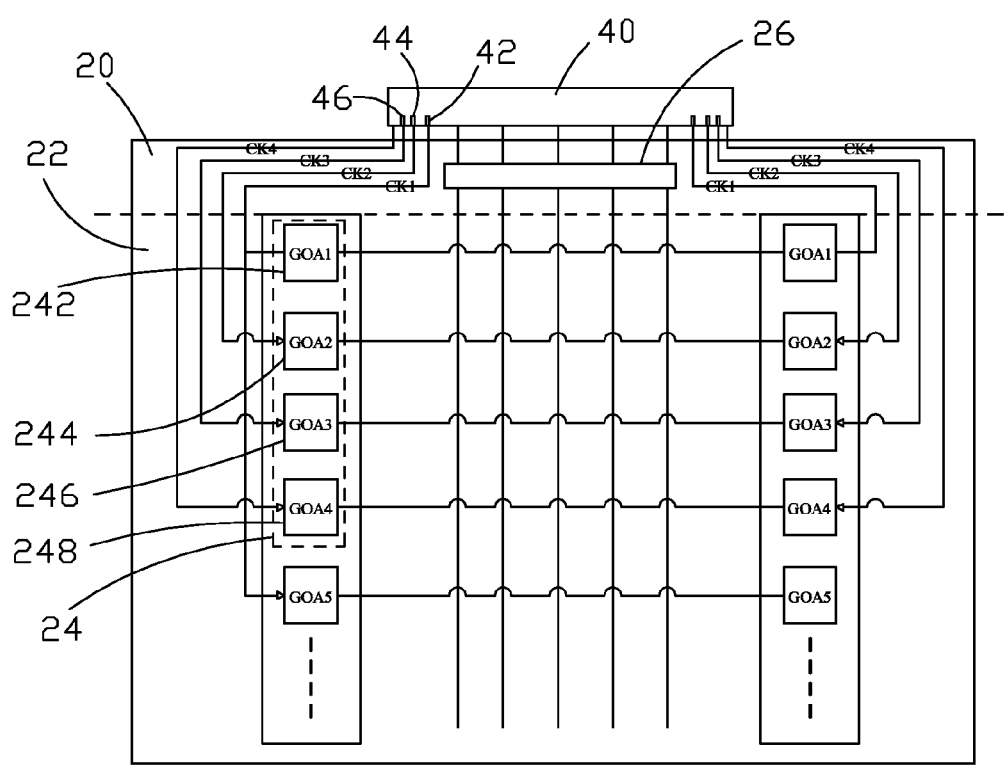
FIG. 5 is a driving circuit diagram of the liquid crystal panel in accordance with one embodiment.
Figure 6:
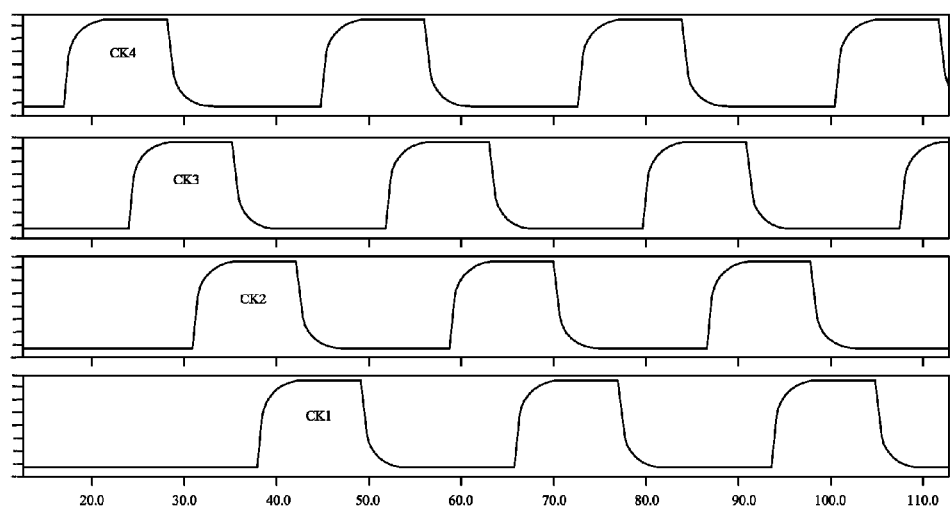
FIG. 6 is a waveform diagram of each clock signals of the liquid crystal panel in accordance with one embodiment.

FIG. 3, also referring to FIGS. 4-6, is a flowchart showing the method for compensating resistance of signal lines of gate driving circuits in accordance with one embodiment.

In step 1, a TFT substrate 20 having a GOA area 22 arranged thereon is provided. The GOA area 22 includes a plurality of GOA units 24. Each of the GOA units 24 includes a plurality of GOA modules electrically connecting to one pull-line.

Referring to FIG. 4, in the embodiment, each GOA units 24 includes a first GOA module 242, a second GOA module 244, a third GOA module 246, and a fourth GOA module 248 arranged in sequence. The pull-lines includes a first pull-line (CK1), a second pull-line (CK2), a third pull-line (CK3), and a fourth pull-line (CK4) electrically connecting to the first GOA module 242, the second GOA module 244, the third GOA module 246, and the fourth GOA module 248 respectively. The length of the first pull-line (CK1), the second pull-line (CK2), the third pull-line (CK3), and the fourth pull-line (CK4) increases in sequence.

In addition, the TFT substrate 20 further includes a source driving chip 26 for providing a source driving signals.

In step 2, a control system board 40 is provided and is electrically connected with the GOA modules via the pull-lines.

The control system board 40 connects with the pull-lines via FPC (not shown).

In step 3, the resistance between the control system board 40 and the GOA modules is adjusted such that the RC delay of the clock signals provided from the control system board 40 to the GOA modules within the same GOA unit 24 is the same.

By arranging the resistors corresponding to the pull-lines on the control system board 40, the resistance between the control system board 40 and the GOA module is adjusted such that the RC delay of the clock signals provided from the control system board 40 to the GOA modules within the same GOA unit 24 is the same. As such, the delay of the gate driving signals are the same and the charging rate of two adjacent pixel rows are the same. Thus, the two pixels rows have the same gray scale, which not only avoids the stripes but also enhance the display performance.

The detailed operations will be described hereinafter. In the embodiment, as the CK4 is the longest one, the RC delay of CK4 is the largest one. As such, the RC delay of RC1, RC2, RC3 are adjusted by referencing to the RC delay of CK4. By adjusting the RC delay of CK1, CK2, and CK3 to be the same with that of CK4, the RC delay of CK1, CK2, CK3, and CK4 are guaranteed to be the same. The control system board 40 also includes a first resistor 42, a second resistor 44, and a third resistor 46 respectively corresponding to the first pull-line (CK1), the second pull-line (CK2), and the third pull-line (CK3) such that the resistance between the control system board 40 and the GOA module may be adjusted. The resistance of the first pull-line (CK1), the second pull-line (CK2), the third pull-line (CK3), the fourth pull-line (CK4) are respectively R1, R2, R3, and R4. The capacitance of the first pull-line (CK1), the second pull-line (CK2), the third pull-line (CK3), the fourth pull-line (CK4) are respectively C1, C2, C3, and C4. The resistance of the first resistor 42, the second resistor 44, the third resistor 46 are respectively Ra, Rb, and Rc. As such, $(R1+Ra)\times C1=(R2+Rb)\times C2=(R3+Rc)\times C3=R4\times C4$.

FIGS. 4 to 6 show a liquid crystal panel in accordance with one embodiment. The liquid crystal panel includes the TFT substrate 20, the control system board 40 electrically connecting to the TFT substrate 20, a CF substrate 60 relatively bonding to the TFT substrate 20, and a liquid crystal layer 80 arranged between the TFT substrate 20 and the CF substrate 60. The control system board 40 electrically connects to the TFT substrate 20 via FPC (not shown). The TFT substrate 20 includes the GOA area 22 and the source driving chip 26 arranged thereon. The GOA area 22 includes a plurality of GOA units 24. Each of the GOA units 24 includes a plurality of GOA modules. The control system board 40 electrically connects to the GOA modules via a plurality of pull-lines so as to provide clock signals for the GOA modules. The control system board 40 includes a plurality of resistors corresponding to the pull-lines, and the number of the resistors is one less than that the number of the pull-lines. In this way, the clock signals provided from the control system board to the GOA modules within the same GOA unit have the same RC delay. Furthermore, the delay of the gate driving signals are the same and the charging rate of two adjacent pixel rows are the same. Thus, the two pixels rows have the same gray scale, which not only avoids the stripes but also enhance the display performance.

The following example will describe the GOA units 24 including four GOA modules.

Referring to FIG. 4, in the embodiment, each of the GOA units 24 includes a first GOA module 242, a second GOA module 244, a third GOA module 246, and a fourth GOA module 248 arranged in sequence. The system control board 40 electrically connects to the first GOA module 242, the second GOA module 244, the third GOA module 246, and the fourth GOA module 248 respectively via the first, second, third, and fourth pull-lines (CK1, CK2, CK3, CK4) for respectively providing the first, second, third, and fourth clock signals. As such, the RC delay of the first, second, third, and fourth clock signals are the same.

The length of the first pull-line (CK1), the second pull-line (CK2), the third pull-line (CK3), and the fourth pull-line (CK4) increases in sequence. As the CK4 is the longest one, the RC delay of CK4 is the largest one. As such, the RC delay of RC1, RC2, RC3 are adjusted by referencing to the RC delay of CK4. By adjusting the RC delay of CK1, CK2, and CK3 to be the same with that of CK4, the RC delay of CK1, CK2, CK3, and CK4 are the same.

In the embodiment, the control system board 40 also includes a first resistor 42, a second resistor 44, and a third resistor 46 respectively corresponding to the first pull-line (CK1), the second pull-line (CK2), and the third pull-line (CK3) so as to increase the RC delay of the first pull-line (CK1), the second pull-line (CK2), and the third pull-line (CK3).

Specifically, the resistance of the first pull-line (CK1), the second pull-line (CK2), the third pull-line (CK3), the fourth pull-line (CK4) are respectively R1, R2, R3, and R4. The capacitance of the first pull-line (CK1), the second pull-line (CK2), the third pull-line (CK3), the fourth pull-line (CK4) are respectively C1, C2, C3, and C4. The resistance of the first resistor 42, the second resistor 44, the third resistor 46 are respectively Ra, Rb, and Rc. As such, $(R1+Ra)\times C1=(R2+Rb)\times C2=(R3+Rc)\times C3=R4\times C4$.

The above embodiment described merely being exemplary embodiments without limiting the claimed invention.

It is to be noted that, in one embodiment, a liquid crystal panel suitable for the GOA unit including six or eight GOA modules is provided. When each of the GOA unit includes six GOA modules, the sixth pull line, which is the longest one, is taken as the reference. The first to the fifth pull-lines are arranged with resistors such that the RC delay of the first to the fifth pull-lines equal to that of the sixth pull-line. Similarly, when each of the GOA unit includes eight GOA modules, the longest eighth pull-line is taken as the reference. The first to the seventh pull-lines are arranged with resistors such that the RC delay of the first to the seventh pull-lines equal to that of the eighth pull-line.

In view of the above, by arranging resistors on the control system board, the clock signals provided from the control system board to the GOA modules within the same GOA unit have the same RC delay. As such, the delay of the gate driving signals are the same and the charging rate of two adjacent pixel rows are the same. Thus, the two pixels rows have the same gray scale, which not only avoids the stripes but also enhance the display performance.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A method for compensating resistance of signal lines of gate driving circuits, comprising:

providing a TFT substrate having a GOA area arranged thereon, the GOA area comprises a plurality of GOA units, each of the GOA units comprises a plurality of GOA modules electrically connecting to one pull-line;

providing a control system board electrically connecting to the GOA modules via the pull-lines;

adjusting the resistance between the control system board and the GOA modules such that the clock signals provided from the control system board to the GOA modules within the same GOA unit is the same, wherein resistors corresponding to the pull-lines are arranged on the control system board to adjust the resistance between the control system board and the GOA modules such that the RC delay of the clock signals provided from the control system board to the GOA modules within the same GOA unit is the same; and wherein the GOA modules comprise a first GOA module, a second GOA module, a third GOA module, and a fourth GOA module arranged in sequence, the pull-lines comprises a first pull-line, a second pull-line, a third pull-line, and a fourth pull-line electrically connecting to the first GOA module, the second GOA module, the third GOA module, and the fourth GOA module respectively, a length of the first pull-line, the second pull-line, the third pull-line, and the fourth pull-line increases in sequence, the control system board further comprises a first resistor, a second resistor, and a third resistor respectively corresponding to the first pull-line, the second pull-line, and the third pull-line, a resistance of the first pull-line, the second pull-line, the third pull-line, and the fourth pull-line are respectively $R_1$, $R_2$, $R_3$, and $R_4$, a capacitance of the first pull-line, the second pull-line, the third pull-line, the fourth pull-line are respectively $C_1$, $C_2$, $C_3$, and $C_4$, the resistance of the first resistor, the second resistor, and the third resistor are respectively $R_a$, $R_b$, and $R_c$, and $(R_1+R_a) \times C_1 = (R_2+R_b) \times C_2 = (R_3+R_c) \times C_3 = R_4 \times C_4$.

2. The method for compensating resistance of signal lines of gate driving circuits as claimed in claim 1, wherein the control board system connects to the pull-lines via flexible printed circuits (FPC).

3. The method for compensating resistance of signal lines of gate driving circuits as claimed in claim 1, wherein the TFT substrate further comprises a source driving chip.

4. A liquid crystal panel, comprising:

a TFT substrate, a CF substrate relatively bonding to the TFT substrate, a liquid crystal layer arranged between the TFT substrate and the CF substrate, and a control system board electrically connecting to the control system board, the TFT substrate comprises a GOA area arranged thereon, the GOA area comprises a plurality of GOA units, each of the GOA units comprises a plurality of GOA modules, the control system board electrically connects to the GOA modules via the pull-lines for providing the clock signals for the GOA modules, and resistors corresponding to the pull-lines are arranged on the control system board such that the RC delay of the clock signals received by the GOA modules within the same GOA unit is the same;

wherein each of the GOA unit comprises a first GOA module, a second GOA module, a third GOA module, and a fourth GOA module arranged in sequence, the system control board electrically connects to the first GOA module, the second GOA module, the third GOA module, and the fourth GOA module respectively via the first, second, third, and fourth pull-lines for respectively providing the first, second, third, and fourth clock signals such that the RC delay of the first, second, third, and fourth clock signals are the same; and wherein a length of the first pull-line, the second pull-line, the third pull-line, and the fourth pull-line increases in sequence, the control system board further comprises a first resistor, a second resistor, and a third resistor respectively corresponding to the first pull-line, the second pull-line, and the third pull-line, a resistance of the first pull-line, the second pull-line, the third pull-line, and the fourth pull-line are respectively $R_1$, $R_2$, $R_3$, and $R_4$, a capacitance of the first pull-line, the second pull-line, the third pull-line, the fourth pull-line are respectively $C_1$, $C_2$, $C_3$, and $C_4$, the resistance of the first resistor, the second resistor, and the third resistor are respectively $R_a$, $R_b$, and $R_c$, and $(R_1+R_a) \times C_1 = (R_2+R_b) \times C_2 = (R_3+R_c) \times C_3 = R_4 \times C_4$.

5. The liquid crystal panel as claimed in claim 4, wherein the control board system connects to the pull-lines via FPC, and the TFT substrate further comprises a source driving chip.

6. The liquid crystal panel as claimed in claim 4, wherein the number of the resistors is one less than that the number of the pull-lines.

* * * * *